(12) United States Patent
Yoshida (10) Patent No.: US 10,998,190 B2
(45) Date of Patent: May 4, 2021

(54) IMPRINT APPARATUS AND METHOD OF MANUFACTURING ARTICLE

(71) Applicant: CANON KABUSHIKI KAISHA, Tokyo (JP)

(72) Inventor: Kenji Yoshida, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 334 days.

(21) Appl. No.: 15/945,280

(22) Filed: Apr. 4, 2018

(65) Prior Publication Data

US 2018/0301331 A1    Oct. 18, 2018

(30) Foreign Application Priority Data

Apr. 17, 2017 (JP) .............................. JP2017-081437
Feb. 2, 2018 (JP) .............................. JP2018-017577

(51) Int. Cl.
*B29C 71/04* (2006.01)
*H01L 21/027* (2006.01)
(Continued)

(52) U.S. Cl.
CPC ........ *H01L 21/0273* (2013.01); *B29C 59/022* (2013.01); *B29C 71/04* (2013.01);
(Continued)

(58) Field of Classification Search
CPC ............. B29C 59/022; B29C 2059/023; G03F 7/0002
(Continued)

(56) References Cited

U.S. PATENT DOCUMENTS 7,298,456 B2    11/2007    Cherala et al.
7,807,065 B2    10/2010    Tokita
(Continued)

FOREIGN PATENT DOCUMENTS

EP     3101476 A2     12/2016
JP     2008504141 A    2/2008
(Continued)

OTHER PUBLICATIONS

Office Action issued in Taiwanese Appln. No. 107109780 dated Jun. 30, 2020. English translation provided.
(Continued)

*Primary Examiner* — Jeffrey M Wollschlager
*Assistant Examiner* — Xue H Liu
(74) *Attorney, Agent, or Firm* — Rossi, Kimms & McDowell LLP (57) ABSTRACT

The present invention provides an imprint apparatus that performs an imprint process of forming a pattern of an imprint material on a processing target region on a substrate by using a mold, including a digital mirror device including two-dimensionally arrayed mirror elements and configured to irradiate the substrate with light reflected by the mirror elements, a measurement unit configured to measure, for each of a plurality of segments obtained by dividing a region in which the mirror elements are arrayed so as to include a plurality of the mirror elements, a light amount of light emitted from each segment, and a control unit configured to control the mirror elements included in each segment based on a measurement result of the measurement unit.

13 Claims, 4 Drawing Sheets

(51) Int. Cl.

| | | |
|---|---|---|
| *B29C 59/02* | (2006.01) | |
| *G02B 26/10* | (2006.01) | |
| *G03F 7/00* | (2006.01) | |
| *B81C 1/00* | (2006.01) | |
| *B29K 101/00* | (2006.01) | |
| *B29K 105/24* | (2006.01) | |
| *H01L 21/308* | (2006.01) | |
| *H01L 21/266* | (2006.01) | |
| *B29L 9/00* | (2006.01) | |

(52) U.S. Cl.
CPC ......... *G02B 26/105* (2013.01); *G03F 7/0002* (2013.01); *B29C 2059/023* (2013.01); *B29K 2101/00* (2013.01); *B29K 2105/246* (2013.01); *B29L 2009/005* (2013.01); *B81C 1/0046* (2013.01); *H01L 21/266* (2013.01); *H01L 21/308* (2013.01)

(58) Field of Classification Search
USPC .......................................... 264/447; 425/385
See application file for complete search history.

(56) References Cited

U.S. PATENT DOCUMENTS

| | | | |
|---|---|---|---|
| 9,019,476 | B2 | 4/2015 | Compen |
| 9,851,634 | B2 | 12/2017 | Matsuda |
| 2016/0299444 | A1 | 10/2016 | Komaki et al. |
| 2017/0068160 | A1 | 3/2017 | Asada et al. |
| 2017/0144363 | A1* | 5/2017 | Nakagawa ............ G03F 7/0002 |
| 2018/0117796 | A1 | 5/2018 | Demura et al. |

FOREIGN PATENT DOCUMENTS

| | | |
|---|---|---|
| JP | 5443574 B2 | 3/2014 |
| JP | 5932286 B2 | 6/2016 |
| TW | 201546565 A | 12/2015 |
| TW | 201707918 A | 3/2017 |
| WO | 2005121892 A2 | 12/2005 |
| WO | 2013111606 A1 | 8/2013 |

OTHER PUBLICATIONS

Office Action issued in Taiwanese Appln. No. 107109780 dated Sep. 19, 2018. English Translation provided.

* cited by examiner

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

As the demand for micropatterning of a semiconductor device, MEMS, and the like increases, a micropatterning process technique of forming a pattern of an imprint material on a substrate by molding the imprint material on the substrate by a mold is gaining attention, in addition to a conventional photolithographic technique. The micropatterning process technique is called an imprint technique and can form, on a substrate, a fine structure on the order of several nanometers.

As one imprint technique, there is, for example, a photocuring method. In an imprint apparatus in which the photocuring method has been adopted, first, an uncured imprint material is supplied (applied) onto a shot region on a substrate. Next, the uncured imprint material supplied on the shot region is molded by bringing (pressing) a mold into contact with the uncured imprint material supplied on the shot region. In a state in which the imprint material and the mold are kept in contact with each other, the imprint material is irradiated with light (for example, ultraviolet rays) and cured, and the mold is separated from the cured imprint material, thereby forming a pattern of the imprint material on the substrate.

In general, a substrate that is to undergo such an imprint process has, for example, undergone a heating process in a deposition process such as sputtering in the device manufacturing process. This may cause the substrate to expand or shrink, and in some cases, the shape (or the size) of the pattern may change in two directions that are perpendicular to each other in a plane. Hence, in an imprint apparatus, when the imprint material on the substrate and the mold are to be brought into contact with each other, there is a need to match the shape of the pattern (pattern on the side of the substrate) already formed on the substrate and the shape of the pattern of the mold.

As a technique of matching the shape of the pattern on the side of the substrate and the shape of the pattern on the mold, Japanese Patent Laid-Open No. 2008-504141 proposes an imprint apparatus that includes a unit which applies an external force to the periphery of a mold to deform (the pattern of) the mold. However, in the imprint apparatus disclosed in Japanese Patent Laid-Open No. 2008-504141, for example, if the material of the mold is quartz, its Poisson's ratio is 0.16. Hence, when one end of the mold is compressed in a predetermined axis direction, an end in a direction perpendicular to the predetermined axis direction of the mold expands. If such a deformation dependent on the Poisson's ratio occurs in the mold, it may influence the overlay accuracy particularly when the mold is to be deformed into a trapezoidal shape since it will be difficult for the surface of the mold to deform linearly. Therefore, Japanese Patent No. 5932286 proposes a technique of matching the shape of a pattern on the side of a substrate to the shape of a pattern of a mold by irradiating the substrate with light, which has a wavelength that does not cure an imprint material, to cause the substrate to undergo heat deformation by the absorbed heat (heating). In the technique disclosed in Japanese Patent No. 5932286, a digital mirror device is used as a light adjustment device to form a predetermined irradiation amount distribution (temperature distribution) on the substrate.

However, in Japanese Patent No. 5932286, the actual heat input amount to the substrate may differ from a desired heat input amount due to a reflectance difference, a defect in mirror elements forming the digital mirror device, and light amount unevenness in the light with which the digital mirror device is irradiated. In this case, the overlay accuracy decreases since the shape of the pattern on the side of the substrate and the shape of the pattern in the mold do not match.

SUMMARY OF THE INVENTION

The present invention provides an imprint apparatus that is advantageous in the point of overlay accuracy between a processing target region which is formed in advance on a substrate and a pattern which is to be newly formed on the substrate.

According to one aspect of the present invention, there is provided an imprint apparatus that performs an imprint process of forming a pattern of an imprint material on a processing target region on a substrate by using a mold, including a digital mirror device including two-dimensionally arrayed mirror elements and configured to irradiate the substrate with light reflected by the mirror elements, a measurement unit configured to measure, for each of a plurality of segments obtained by dividing a region in which the mirror elements are arrayed so as to include a plurality of the mirror elements, a light amount of light emitted from each segment, and a control unit configured to control the mirror elements included in each segment based on a measurement result of the measurement unit.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1:
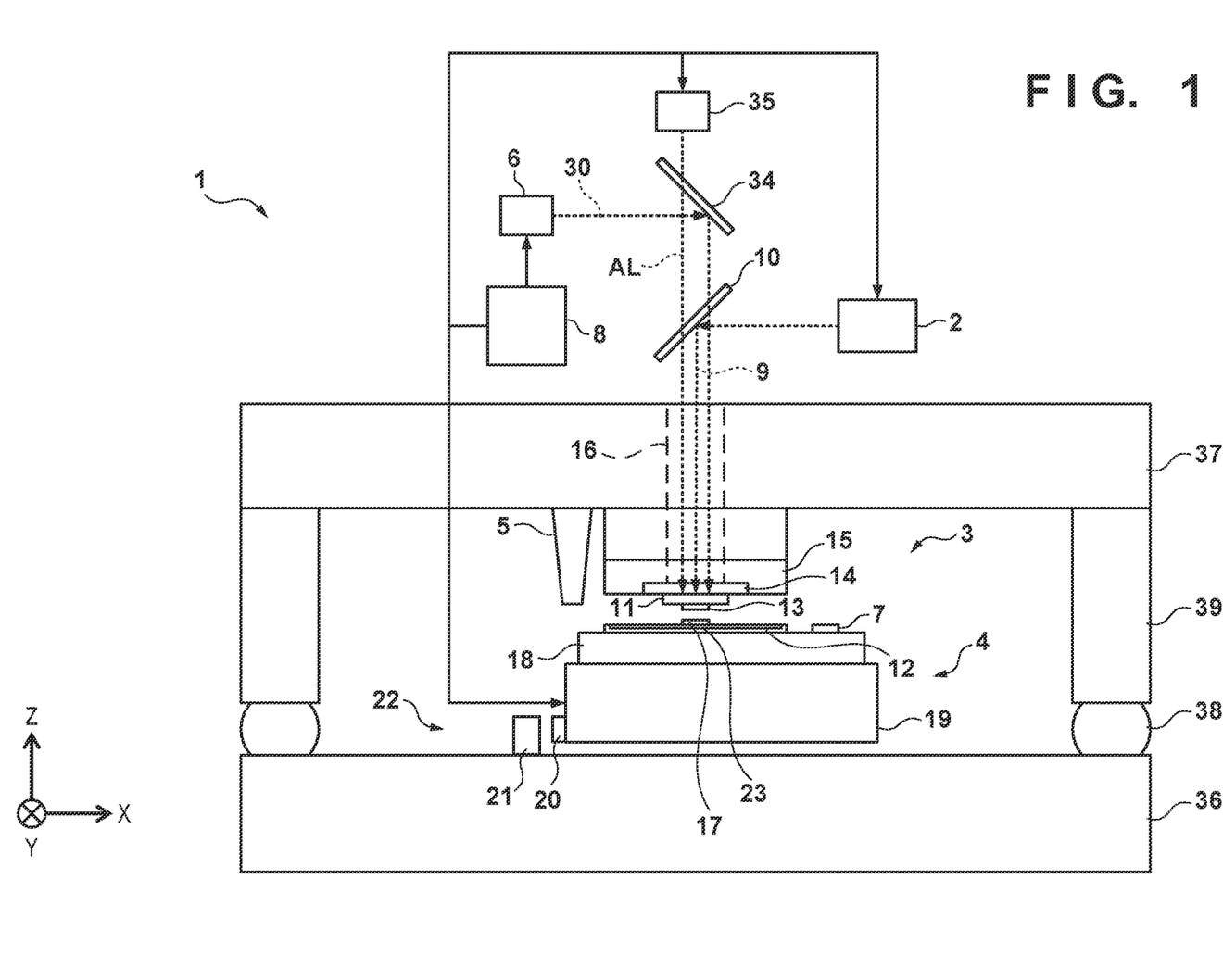
FIG. 1 is a schematic view showing the arrangement of an imprint apparatus as one aspect of the present invention.

FIG. 1 is a schematic view showing the arrangement of an imprint apparatus 1 as an aspect of the present invention. The imprint apparatus 1 is a lithography apparatus that is used for manufacturing a device such as a semiconductor device as an article and performs an imprint process of forming a pattern of an imprint material on a substrate by using a mold. In this embodiment, the imprint apparatus 1 brings an imprint material supplied on to the substrate and a mold into contact with each other and applies a curing energy to the imprint material to form a cured material pattern on which a concave-convex pattern of a mold is transferred.

An imprint material to be used includes a curable composition (also sometimes called an uncured resin) which is cured by application of curing energy. Curing energy to be used includes an electromagnetic wave and heat. An electromagnetic wave to be used includes, for example, light such as infrared light, visible light, or ultraviolet light selected from the wavelength range of 10 nm or more to 1 mm or less.

A curable composition is a composition which is cured by irradiation with light or application of heat. A curable composition which is cured by irradiation with light contains at least a polymerizable compound and a photopolymerization initiator, and may contain a nonpolymerizable compound or solvent as needed. A nonpolymerizable compound is at least one type of compound selected from the group consisting of a sensitizer, a hydrogen donor, an internal mold release agent, a surfactant, an antioxidant, and a polymer component.

An imprint material may be supplied in a film form onto a substrate by a spin coater or slit coater. Alternatively, an imprint material may be supplied by a liquid-ejecting head in a droplet form, an island form with droplets being chained together, or a film form onto a substrate. The viscosity (at 25° C.) of the imprint material is 1 mPa·s or more to 100 mPa·s or less.

A substrate to be used is made of glass, ceramic, a metal, a semiconductor, and a resin. A member formed from a material different from a substrate may be formed on its surface, as needed. More specifically, a substrate to be used includes a silicon wafer, a compound semiconductor wafer, and a silica glass wafer.

In this embodiment, the imprint apparatus 1 adopts a photocuring method as the curing method of the imprint material. Note that, as shown in FIG. 1, a direction parallel to an optical axis of an irradiation unit that irradiates the imprint material on the substrate with light is set as the Z-axis, and directions orthogonal to each other within a plane perpendicular to the Z-axis are set as the X- and Y-axes.

The imprint apparatus 1 includes an irradiation unit 2, a mold holding unit 3, a substrate stage 4, a supply unit 5, a heating unit 6, a sensor 7, a control unit 8, and an alignment measurement unit 35. The imprint apparatus 1 also includes a base plate 36 on which the substrate stage 4 is placed, a bridge plate 37 to which the mold holding unit 3 is fixed, and a column 39 which extends from the base plate 36 and supports the bridge plate 37 via an antivibrator 38. The antivibrator 38 reduces (removes) the vibrations transmitted from a floor surface to the bridge plate 37. Furthermore, the imprint apparatus 1 also includes a mold conveyance unit (not shown) that conveys a mold 11 from the outside to the mold holding unit 3 and a substrate conveyance unit (not shown) that conveys a substrate 12 from the outside to the substrate stage 4.

In an imprint process, the irradiation unit 2 irradiates an imprint material 17 on the substrate with ultraviolet rays 9 via a dichroic mirror 10 and the mold 11. The irradiation unit 2 includes, for example, a light source and an optical element that adjusts the ultraviolet rays 9 emitted from the light source so that the rays will be suitable for the imprint process.

The mold 11 has a polygonal (rectangular) peripheral shape and has a three-dimensionally formed pattern (a concave-convex pattern, such as a circuit pattern, which is to be transferred on to the substrate 12) 13 on a surface facing the substrate 12. The mold 11 is formed from a material, such as quartz, through which the ultraviolet rays 9 can be transmitted. The mold 11 also includes, on a surface (a surface on the incident side of the ultraviolet rays 9) on the opposite side of the surface facing the substrate 12, a cavity (concave portion) to facilitate the deformation of a mold 11 (pattern 13). The cavity has a circular planar shape, and the depth of the cavity is set in accordance with the size and the material of the mold 11.

The mold holding unit 3 includes a mold chuck 14 that holds the mold 11 and a mold driving unit 15 that moves the mold 11 (mold chuck 14) while holding the mold chuck 14.

The mold chuck 14 holds the mold 11 by chucking the peripheral region of the surface of the mold 11 on the incident side of the ultra-violet 9 by a vacuum suction force or an electrostatic force. For example, in a case in which the mold chuck 14 is to hold the mold 11 by a vacuum suction force, the mold chuck 14 is connected to a vacuum pump installed outside and the attachment/detachment (holding and releasing the hold) of the mold 11 can be switched by turning on and off the vacuum pump.

The mold driving unit 15 moves the mold 11 in the Z-axis direction so as to selectively press (pressing process) the mold 11 onto the imprint material 17 on the substrate or separate (release process) the mold 11 from the imprint material 17 on the substrate. An actuator applicable as the mold driving unit 15 includes, for example, a linear motor or an air cylinder. To determine the position of the mold 11 with high accuracy, the mold driving unit 15 may be formed from a plurality of driving systems such as a coarse driving system and a fine driving system. The mold driving unit 15 may be formed to move the mold 11 in not only the Z-axis direction but also in the X-axis direction and the Y-axis direction. Furthermore, the mold driving unit 15 may be formed to have a tilt function of adjusting the tilt of the mold 11 and the position of the mold 11 in the θ (rotation about the Z-axis) direction.

The pressing process and the release process in the imprint apparatus 1 may be implemented by moving the mold 11 in the Z-axis direction as shown in this embodiment, but may also be implemented by moving the substrate 12 (substrate stage 4) in the Z-axis direction. Also, the pressing process and the release process may be implemented by moving both the mold 11 and the substrate 12 relatively in the Z-axis direction.

The mold chuck 14 and the mold driving unit 15 include an opening 16 in the center portion (inside) so that the imprint material 17 on the substrate is irradiated with the ultraviolet rays 9 from the irradiation unit 2. A light transmitting member is arranged in the opening 16 so as to make the space which is surrounded by a part of the opening 16 and the mold 11 into a sealed space, and the pressure inside the sealed space is adjusted by a pressure adjustment device including a vacuum pump and the like. For example, when the imprint material 17 on the substrate and the mold 11 are to be brought into contact with each other, the pressure adjustment device can raise the pressure inside the sealed space to be higher than the external pressure to warp (deform) the pattern 13 of the mold 11 into a convex shape toward the substrate 12. As a result, the center portion of the pattern 13 of the mold 11 can come into contact with the imprint material 17 first. This can suppress the air from remaining between the mold 11 and the imprint material 17, and the imprint material 17 can fill all parts of the pattern 13 (concave portion) of the mold 11.

The substrate 12 is supplied (applied) with the imprint material 17 which is molded by the pattern 13 of the mold 11.

The substrate stage 4 holds the substrate 12 and is used for positioning (alignment) the mold 11 and the substrate 12 when the imprint material 17 on the substrate and the mold 11 are brought into contact with each other. The substrate stage 4 includes a substrate chuck 18 that chucks and holds the substrate 12 and a stage driving unit 19 that can mechanically hold and move the substrate chuck 18 in each axis direction.

An actuator applicable as the stage driving unit 19 includes, for example, a linear motor or a planar motor. To determine the position of the substrate 12 with high accuracy, the stage driving unit 19 may be formed from a plurality of driving systems such as a coarse driving system and a fine driving system. The stage driving unit 19 may be formed to move the substrate 12 in not only the X-axis direction and the Y-axis direction but also in the Z-axis direction. Furthermore, the stage driving unit 19 may be formed to have a tilt function of adjusting the tilt of the mold substrate 12 and the position of the substrate 12 in the θ (rotation about the Z-axis) direction.

On a side surface of the substrate stage 4, an encoder scale 20 corresponding to each of the X-, Y-, and Z-axes directions is arranged. An encoder system 22 irradiates the encoder scale 20 with a beam from an encoder head 21 to measure the position of the substrate stage 4. The encoder system 22 measures the position of the substrate stage 4 in real time. The control unit 8 executes positioning of the substrate stage 4 based on the measurement values of the encoder system 22.

The supply unit 5 is arranged near the mold holding unit 3 and supplies (applies) an uncured imprint material 17 onto the substrate 12. In this embodiment, the imprint material 17 is an ultraviolet curable resin material that has a property of being cured by irradiation with the ultraviolet rays 9. The imprint material 17 is selected in accordance with various kinds of information such as the manufacturing process of the semiconductor device. The supply amount of the imprint material 17 that is to be supplied from the supply unit 5 is determined in accordance with the density and thickness (residual layer thickness) of the pattern of the imprint material 17 which is to be formed on the substrate 12.

The heating unit 6 deforms (that is, corrects the shape of a pattern region 23) the pattern region 23 (shot region) already formed on the substrate by heating the substrate 12 that is conveyed to the imprint apparatus 1 and held by the substrate stage 4. In this embodiment, the pattern region 23 is a processing target region that includes one shot region. However, the pattern region 23 may be a processing target region that includes a plurality of shot regions (that is, a pattern may be formed on a plurality of shot regions in one imprint process in some cases). Note that the shot region corresponds to a repetitive pattern that is formed by using a reticle or a mask when forming a pattern by an exposure apparatus on an upper layer of a substrate on which a pattern has been formed in the imprint apparatus 1. For example, in one shot region, one or a plurality of patterns of a chip size desired by a user are formed.

Figure 2:
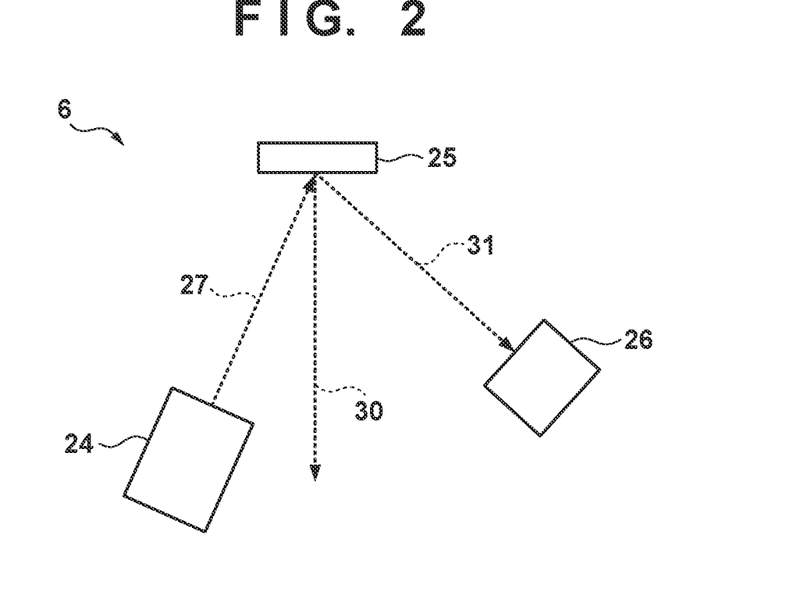
FIG. 2 is a schematic view showing the arrangement of a heating unit in the imprint apparatus shown in FIG. 1.

FIG. 2 is a schematic view showing the arrangement of the heating unit 6. The heating unit 6 includes a light source unit 24, a light adjustment device 25, and a light absorbing portion 26. The light source unit 24 functions as a heat source for heating the substrate 12 and irradiates, in this embodiment, the light adjustment device 25 with a light 27 of a wavelength which will not cure the imprint material 17. For example, if the imprint material 17 is cured by a wavelength between 300 nm and 400 nm, the light source unit 24 emits a light having a wavelength band of 470 nm.

Figure 3:
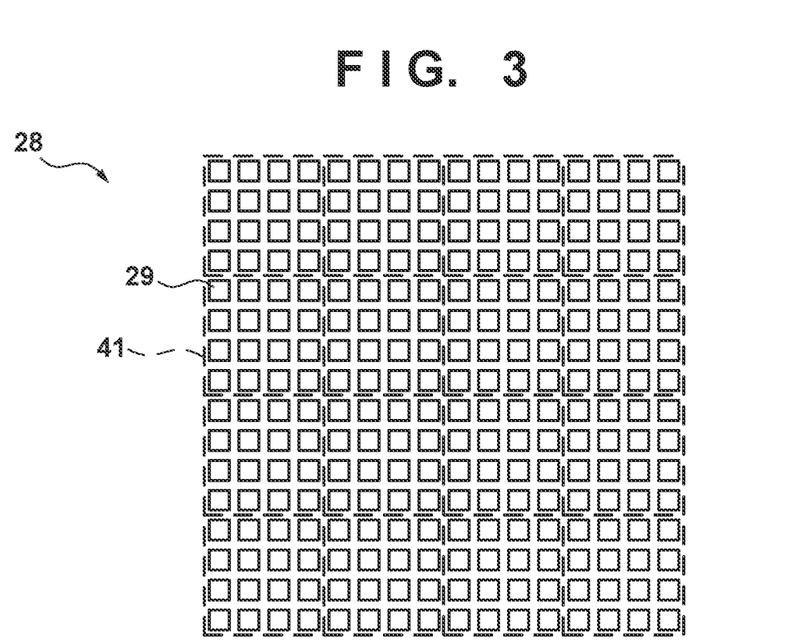
FIG. 3 is a schematic view showing the arrangement of a digital mirror device.

When correcting the shape of the pattern region 23 on the substrate, the light adjustment device 25 forms a temperature distribution on the substrate by forming an irradiation amount distribution on the substrate. As shown in FIG. 3, the light adjustment device 25 is formed by a digital mirror device 28. FIG. 3 is a schematic view showing the arrangement of the digital mirror device 28. As shown in FIG. 3, the digital mirror device 28 includes a plurality of mirror elements 29 that form reflecting surfaces and are arranged two-dimensionally (in a matrix). The mirror elements 29 can change the reflecting direction of the light 27, which is emitted from the light source unit 24, and form an arbitrary irradiation amount distribution on the pattern region 23 on the substrate. The control unit 8 controls (the driving of) each mirror element 29 separately.

Figure 4:
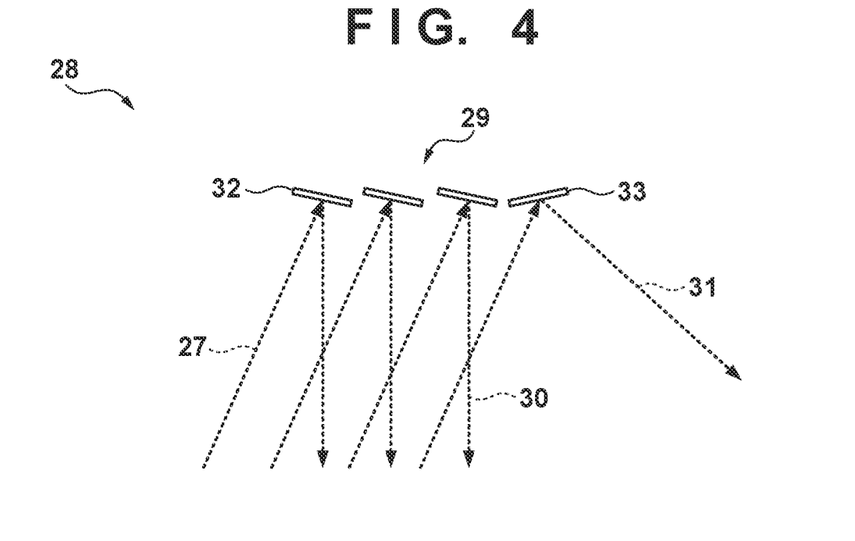
FIG. 4 is a schematic view showing a section of mirror elements of the digital mirror device.

FIG. 4 is a schematic view showing the sections of the mirror elements 29 that form the digital mirror device 28 and shows the driving state of the mirror elements 29. As shown in FIG. 4, the mirror elements 29 form an arbitrary irradiation amount distribution by being driven (tilted) to an ON state 32 in which the light 27 is reflected in a direction 30 toward the substrate 12 or to an OFF state 33 in which the light 27 is reflected in a direction 31 toward the light absorbing portion 26. The light amount gradation of the light with which the substrate 12 is irradiated is controlled by controlling the time (irradiated time) in which each mirror element 29 is set to the ON state 32 and the time (unirradiated time) in which each mirror element is set to the OFF state 33.

As shown in FIG. 1, the substrate 12 is irradiated, via a dichroic mirror 34, with the light 27 reflected in the direction 30 toward the substrate 12 by each mirror element 29. The division count of the digital mirror device 28, that is, the number of mirror elements 29 forming the digital mirror device 28 is appropriately determined in accordance with the required irradiation amount distribution.

When each mirror element 29 forming the digital mirror device 28 is driven to the OFF state 33, the light absorbing portion 26 absorbs the light 27 reflected by the mirror element 29. The light absorbing portion 26 absorbs the emitted light 27 by converting the light into heat. Therefore, the light absorbing portion 26 preferably includes a cooling mechanism.

The sensor 7 is arranged on the substrate stage 4 so as to have the same height as the substrate 12 held by the substrate stage 4. Among the plurality of mirror elements 29 included in the digital mirror device 28, the sensor 7 measures the light amount (irradiation amount distribution) of the light reflected by at least some of the mirror elements 29. The sensor 7 is, for example, a photoelectric conversion element that converts the received light into an electrical signal. In a period in which the imprint process is not performed such as a maintenance period, the sensor 7 measures, while scanning the substrate stage 4, the light amount of the light 27 with which the substrate 12 is irradiated from the digital mirror device 28.

The control unit 8 is formed by a computer that includes a CPU and a memory and controls each unit of the imprint apparatus 1 in accordance with a program stored in the memory. The control unit 8 controls the imprint process of forming a pattern on the substrate by controlling the operation and adjustment of each unit in the imprint apparatus 1. In this embodiment, as will be described in detail later, the control unit 8 controls the heating unit 6 based on the measurement results of the sensor 7. The control unit 8 may be integrally formed (in a common housing) with the other parts of the imprint apparatus 1 or may be separately formed (in a separate housing) with the other parts of the imprint apparatus 1.

The alignment measurement unit 35 measures, when an imprint process is to be performed, the position and the shape of the pattern region 23 on the substrate by irradiating the substrate 12 with an alignment light AL and detecting the alignment light AL reflected on the substrate 12.

The imprint process in the imprint apparatus 1 will be described. As described above, the imprint process is performed by the control unit 8 integrally controlling each unit of the imprint apparatus 1. First, the control unit 8 causes the substrate conveyance unit to convey the substrate 12 and the substrate stage 4 (substrate chuck 18) to hold the substrate. Next, the control unit 8 drives the stage driving unit 19 to position the shot region (pattern region 23) on the substrate in the supply position of the supply unit 5. Next, the control unit 8 causes the supply unit 5 to supply the imprint material 17 onto the shot region on the substrate. Next, the control unit 8 drives the stage driving unit 19 so that the shot region on the substrate supplied with the imprint material 17 is positioned immediately below the mold 11. Next, the control unit 8 drives the mold driving unit 15 to bring the imprint material 17 on the substrate and the mold 11 into contact with each other. As a result, the imprint material 17 on the substrate fills the pattern 13 (concave portion) of the mold 11. Next, the control unit 8 causes the irradiation unit 2 to irradiate, via mold 11, the imprint material 17 on the substrate with the ultraviolet rays 9 to cure the imprint material 17. Next, the control unit 8 drives the mold driving unit 15 to separate the mold 11 from the cured imprint material 17 on the substrate. As a result, the three-dimensionally shaped pattern of the imprint material 17 corresponding to the pattern 13 of the mold 11 is formed on the shot region on the substrate. These series of operations can be performed on each of the plurality of shot regions on the substrate to form a pattern of the imprint material 17 on each of the plurality of shot regions.

The substrate 12 that is to undergo the imprint process in the imprint apparatus 1 has, for example, undergone a heating process in a deposition process such as sputtering in the device manufacturing process. Hence, the substrate 12 may have expanded or shrunk before being conveyed into the imprint apparatus 1, and the shape of the pattern region 23 in the two directions perpendicular to each other in the X-Y plane may have changed. The deformation of the pattern region 23 mainly includes a scaling component, a parallelogram component, and a trapezoid component, and it may be a combination of these components in some cases.

Hence, in the imprint apparatus 1, when the imprint material 17 on the substrate and the mold 11 are to be brought into contact with each other, the shape of the pattern region 23 of the substrate 12 needs to be corrected to match the shape of the pattern 13 of the mold 11. In this embodiment, the control unit 8 obtains, from the measurement result of the alignment measurement unit 35, the correction amount necessary to match the shape of the pattern region 23 of the substrate 12 to the shape of the pattern 13 of the mold 11. Then based on the correction amount, the pattern region 23 of the substrate 12 undergoes heat deformation by the heating unit 6 to match the shape of the pattern region 23 of the substrate 12 to the shape of the pattern 13 of the mold 11. In other words, under the control of the control unit 8, the heating unit 6 (digital mirror device 28) heats the pattern region 23 so as to reduce (to set within a tolerable range) the shape difference between the pattern region 23 of the substrate 12 and the pattern 13 of the mold 11.

Due to initial failures or age deterioration in the digital mirror device 28 forming the heating unit 6, a defect in which the mirror element 29 becomes fixed can occur. Also, due to reflectance differences between the mirror elements 29, light amount unevenness of the light 27 emitted from the light source unit 24, or the optical performance of the optical element arranged in the optical path from the light source unit 24 to the substrate 12, a light amount error in which the light amount of the light with which the substrate 12 is irradiated differs from a target light amount can occur.

In order to minimize these influences, in this embodiment, the region in which the mirror elements 29 are two-dimensionally arranged is made smaller than the shot region on the substrate as shown in FIG. 3, and units of control are divided (separated) into a plurality of segments 41 so as to include a plurality of mirror elements 29. The number of segments 41 is arbitrary as long as the conditions are satisfied. For example, in this embodiment, assume that the number of segments 41 is 600 and that the arrangement shown in FIG. 3 represents some of all the mirror elements 29 in the digital mirror device 28. The control unit 8 controls the digital mirror device 28 for each segment 41 which is a set of the plurality of mirror elements 29. For example, the light amount of light with which the substrate 12 is irradiated from each segment is calibrated by correcting, for each segment 41, the light amount error caused from the defects and reflectances of the mirror elements 29, light amount unevenness of the light from the light source unit 24, and the like.

More specifically, first, the light amount (light amount distribution) of light emitted to the substrate 12 from the heating unit 6, that is, the digital mirror device 28 is measured. Of the region in which the mirror elements 29 are arranged, the control unit 8 sets the mirror elements 29 in a region corresponding to the shot region, which is a region on the substrate to which a pattern is to be formed in one imprint process, to the ON state 32 and sets the mirror elements 29 in the remaining region to the OFF state 33. In addition, the control unit 8 causes the sensor 7 to measure the light amount of the light 27 with which the substrate stage 4 is irradiated from the digital mirror device 28 by scanning the substrate stage 4 so that the sensor 7 can cover the entire shot region. The control unit 8 obtains, based on each measurement result of the sensor 7, a light amount (integrated value) A for each segment 41 of the digital mirror device 28. Next, the control unit 8 obtains a calibration value for each segment 41 of the digital mirror device 28. Letting Amin be the minimum value (minimum light amount) of the light amount A, the calibration value of each segment 41 is Amin/A. Note that each segment 41 has a region of a degree that does not influence the overlay accuracy between the pattern region 23 on the substrate and the pattern 13 of the mold 11, and the size of the region of each segment can be changed in accordance with the requested overlay accuracy. For example, assume a case in which a shot region of 30 mm (vertical)×20 mm (horizontal) has been set on the substrate and (the region of) each segment 41 has been set to 1 mm square on the substrate. In this case, the mirror elements 29 in a region corresponding to the 30 mm (vertical)×20 mm (horizontal) region on the substrate is set to the ON state 32, and the mirror elements 29 in the other remaining region are set to the OFF state 33. In this state, by causing the substrate stage 4 to scan so that the entire shot region will be covered by the sensor 7, the light amount of the light 27 with which the substrate stage 4 is irradiated from the digital mirror device 28 will be measured by the sensor 7. As a result, light amounts (integrated values) A1, A2, A3, . . . , A600 of the respective segments 41 are obtained. In this manner, the sensor 7 measures the light amount of light with which the substrate 12 (substrate stage 4) is irradiated from each segment 41 and obtains the data. Also, the sensor 7 is formed to measure the light amount of each region that is smaller than the region on the substrate corresponding to each of the plurality of segments 41. Assume that Amin is the minimum value among the light amounts (integrated values) A1, A2, A3, . . . , A600 of the respective segments 41. In this case, the calibration values of the segments 41 are Amin/A1, Amin/A2, Amin/A3, . . . , Amin/A600, respectively. The calibration values are used to correct the shape of the pattern region 23 of the substrate 12.

The correction process of correcting the shape of the pattern region 23 of the substrate 12 in the imprint apparatus 1 will be described with reference to FIG. 5. As described above, in this embodiment, a temperature distribution is formed inside and outside the pattern region 23 by the heating unit 6 to correct the shape of the pattern region 23 of the substrate 12, that is, the deformation component of the pattern region 23.

In step S502, the control unit 8 causes the alignment measurement unit 35 to measure the shape of the pattern region 23 of the substrate 12. In step S504, the control unit 8 analyzes, based on the measurement result of the alignment measurement unit 35 in step S502, the deformation component included in the pattern region 23 of the substrate 12 and obtains a correction amount necessary to match the shape of the pattern region 23 to the shape of the pattern 13 of the mold 11. In step S506, the control unit 8 obtains, based on the correction amount obtained in step S504, the light amount for each segment 41 of the digital mirror device 28 necessary for correcting the shape of the pattern region 23 of the substrate 12.

In step S508, the control unit 8 separately controls, based on the product between each calibration value described above and each light amount obtained in step S506, the mirror elements 29 for each segment 41 of the digital mirror device 28. For example, in order to obtain the target light amount for each segment 41, the control unit 8 controls the ratio of the irradiated time (time in which the ON state 32 is set) of light to the substrate 12 by the mirror elements 29 and the unirradiated time (time in which the OFF state 33 is set) for each segment 41. More specifically, if a command value from the control unit 8 to an arbitrary segment 41 is 1, all of the mirror elements 29 in the segment corresponding to the command value are set to the ON state 32. Also, if the command value from the control unit 8 to the arbitrary segment 41 is 0.75, the mirror elements 29 in the segment is set to the ON state 32 for 7.5 msec and the mirror elements 29 is set to the OFF state 33 for the subsequent 2.5 msec. The state switching of the mirror elements 29 in the segment in this manner will be repeated until the command value is changed. In this manner, for each segment 41, the light amount is adjusted by controlling the time in which the mirror elements 29 are set to the ON state 32 and the time in which the mirror elements are set to the OFF state 33 (ratio of the irradiated time and the unirradiated time).

In this embodiment, the mirror elements 29 included in each of the segments 41 are controlled separately so that the light amount of light with which the substrate 12 is irradiated from each of the plurality of segments 41 will be a target light amount when an imprint process is to be performed based on the measurement results of the sensor 7. More specifically, the ratio of the irradiated time and the unirradiated time of light to the substrate 12 from the mirror elements 29 for each segment 41 is controlled so that the target light amount can be obtained in each segment 41. At this time, as described above, the minimum light amount is specified, from the measurement results of the sensor 7, among the maximum light amounts of light with which the substrate 12 can be irradiated from the plurality of segments 41, and the light amounts between the segments are calibrated using the minimum light amount as a reference. For example, if the maximum light amount of light with which the substrate 12 is irradiated from a predetermined segment 41 is smaller than the maximum light amount of light with which the substrate 12 is irradiated from another segment 41, the light amount of the predetermined segment 41 is calibrated by using the light amount of the other segment 41 as a reference. Here, the measurement results of the sensor 7 are sets of data obtained by measuring the light amount of light with which the substrate 12 is irradiated from each segment 41.

Figure 5:
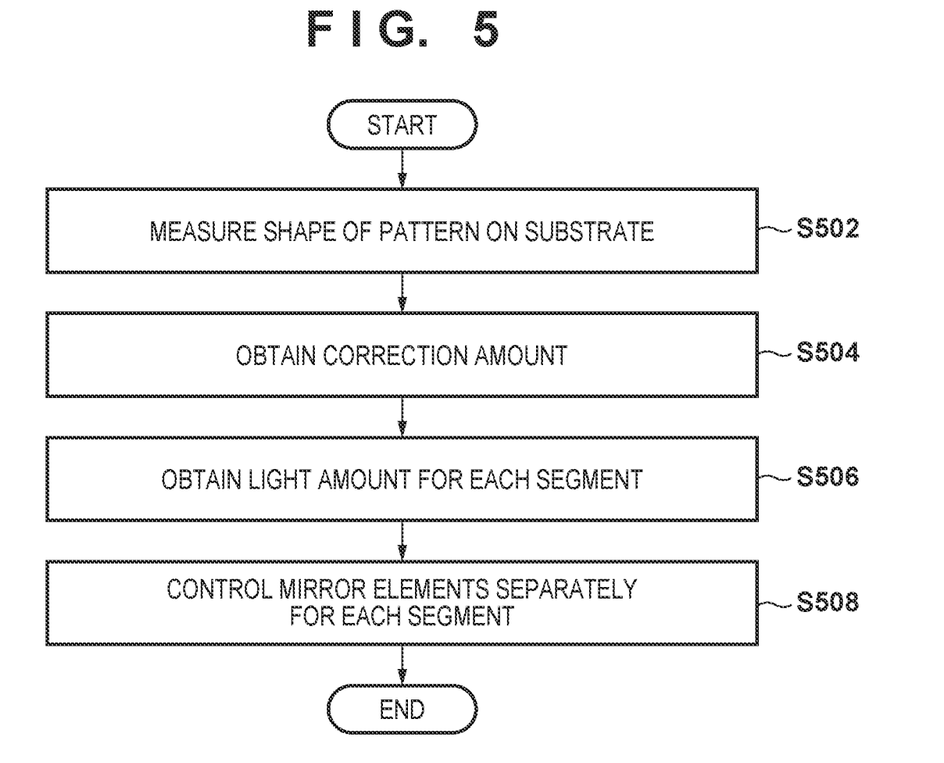
FIG. 5 is a flowchart for explaining a correction process to correct the shape of a pattern of a substrate in the imprint apparatus shown in FIG. 1.

The correction process shown in FIG. 5 is performed during or after the pressing process before the imprint material 17 on the substrate is cured. The control unit 8 cures the imprint material 17 on the substrate after matching the shape of the pattern region 23 of the substrate 12 and the shape of the pattern 13 of the mold 11 by the correction process shown in FIG. 5. Also, in order to facilitate the correction of the shape of the pattern region 23 of the substrate 12, the suction force of the substrate chuck 18 to a region corresponding to the pattern region 23 can be reduced locally. In this manner, in the imprint apparatus 1, by correcting the shape of the pattern region 23 of the substrate 12, the shape of the pattern region 23 and the shape of the pattern 13 of the mold 11 can be matched with high accuracy. For example, in this embodiment, the shape of the pattern region 23 and the shape of the pattern 13 of the mold 11 can be matched with higher accuracy than in a case in which the shape of the pattern 13 is corrected by displacing or applying an external force to the side surface of the mold 11. Hence, the pattern region 23 of the substrate 12 can be overlaid on the pattern of the newly formed imprint material 17 with high accuracy. Note that in the imprint apparatus 1, a shape correction mechanism that corrects the shape of the pattern 13 by displacing or applying an external force to the side surface of the mold 11 may be used in combination. Also, as described above, although the correction process shown in FIG. 5 is preferably performed during or after the pressing process before the imprint material 17 on the substrate is cured, it can also be performed before the pressing process.

In step S508, the number of mirror elements 29 to be set to the ON state 32 and the number of mirror elements 29 to be set to the OFF state 33 in each segment 41 can be controlled so that a target light amount can be obtained in each segment 41. In other words, when obtaining the same target light amount for each of the segments 41, the number of mirror elements 29 that irradiate the substrate 12 with light can be controlled for each segment 41. For example, in the digital mirror device 28 shown in FIG. 3, each segment 41 includes 16 mirror elements 29. In a case in which the command value from the control unit 8 to an arbitrary segment 41 is 1, assume that all of the mirror elements 29 in the segment corresponding to the command value will be set to the ON state 32. Also, in a case in which the command value from the control unit 8 to the arbitrary segment 41 is 0.75, assume that, of the mirror elements 29 in the segment, 12 mirror elements 29 will be set to the ON state 32 and 4 mirror elements 29 will be set to the OFF state 33. At this time, based on the measurement result of the sensor 7, the control unit 8 specifies the number of defective mirror elements 29 that cannot irradiate the substrate 12 with light for each segment 41 and controls for each segment 41 the number of mirror elements 29 that irradiate the substrate 12 with light based on the number of defective mirror elements. More specifically, in a case in which the number of defective mirror elements 29 is 0 and the command value from the control unit 8 to the arbitrary segment 41 is 0.5, of the mirror elements 29 in the segment, 8 mirror elements 29 will be set to the ON state 32 and 8 mirror elements 29 will be set to the OFF state 33. However, in a case in which the number of defective mirror elements 29 is 3, the defective mirror elements are taken into consideration, 8 mirror elements 29 are set to the ON state 32 and 5 mirror elements 29 are set to the OFF state 33. In this manner, the light amount is adjusted by controlling the number of mirror elements 29 set to the ON state 32 and the number of mirror elements 29 set to the OFF state 33 for each segment 41.

In this embodiment, although the imprint apparatus 1 obtains data (that is, measures by the sensor 7) by measuring the light amount of light with which the substrate is irradiated from each segment 41, the present invention is not limited this. For example, the data may be obtained by measuring the light amount of light with which the substrate is irradiated from each segment 41 by a measurement device outside of the imprint apparatus 1.

In addition, in this embodiment, the shape difference between the pattern region 23 of the substrate 12 and the pattern 13 of the mold 11 is obtained from the measurement result of the alignment measurement unit 35. However, the shape difference between the pattern region 23 of the substrate 12 and the pattern 13 of the mold 11 can be measured by a measurement device outside the imprint apparatus 1. In this case, the measurement result of the external measurement device is input to the control unit 8 manually or automatically via a communication circuit. The external measurement device includes, for example, an overlay inspection apparatus. The overlay inspection apparatus inspects, for a plurality of marks, the positional shifts between the marks formed around the pattern region 23 and the marks simultaneously formed around a pattern at the time of the formation of the pattern, which is formed on the substrate by performing pattern formation without deforming the pattern 13. As a result, information indicating the shape difference between the pattern 13 and the pattern region 23 can be obtained. Based on the information indicating the shape difference between the pattern 13 and the pattern region 23 that is obtained in this manner, the control unit 8 calculates the correction amount for correcting the shape of the pattern 13 of the mold 11 and the correction amount for correcting the shape of the pattern region 23 of the substrate 12. Note that the calculation of these correction amounts can be performed outside the imprint apparatus 1.

According to this embodiment, there is provided an imprint apparatus 1 that is advantageous in terms of the overlay accuracy between the pattern region 23 (the process region formed in advance on the substrate) of the substrate 12 and the pattern of the imprint material 17 to be newly formed on the substrate.

The pattern of the cured product that has been formed using the imprint apparatus 1 is used permanently for at least some of various articles or used temporarily when the various articles are manufactured. The article includes an electric circuit element, an optical element, a MEMS, a printing element, a sensor, a die, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The die includes an imprinting mold or the like.

The pattern of the cured product is used without any change as a constituent member of at least a part of the above-described article or used temporarily as a resist mask. The resist mask is removed after etching, ion implantation, or the like is performed in a processing step of the substrate.

Figure 6A:
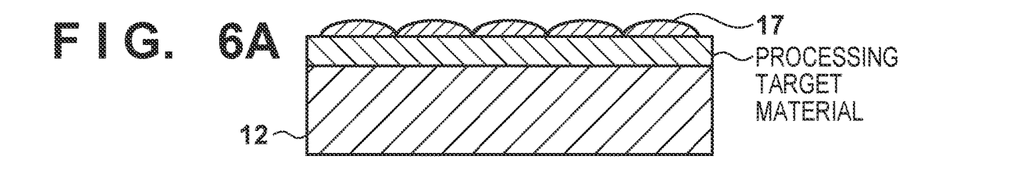
FIGS. 6A to 6F are views for explaining a method of manufacturing an article.

A detailed method of manufacturing the article will now be described. As shown FIG. 6A, the substrate 12 such as a silicon wafer having a processing target material such as an insulator formed on its surface is prepared, and then an imprint material 17 is applied on the surface of the processing target material by an inkjet method or the like. A state is shown here in which the imprint material 17 formed into a plurality of droplets is applied on the substrate.

Figure 6B:
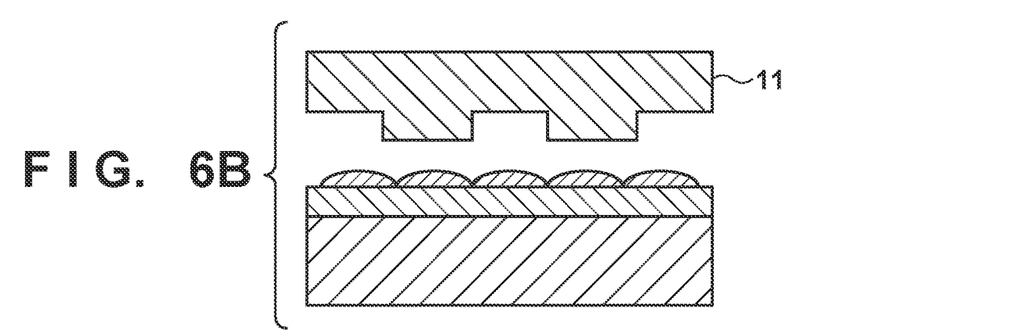
Figure 6C:
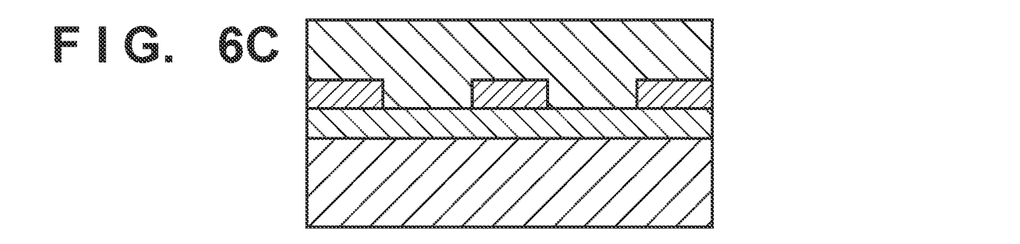

As shown in FIG. 6B, a side of the imprinting mold 11 on which its concave-convex pattern is formed faces the imprint material 17 on the substrate. As shown in FIG. 6C, the mold 11 and the substrate 12 to which the imprint material 17 is applied are brought into contact with each other, applying a pressure. The imprint material 17 fills the gap between the mold 11 and the processing target material. The imprint material 17 is cured by irradiating it with light as curing energy through the mold 11 in this state.

Figure 6D:
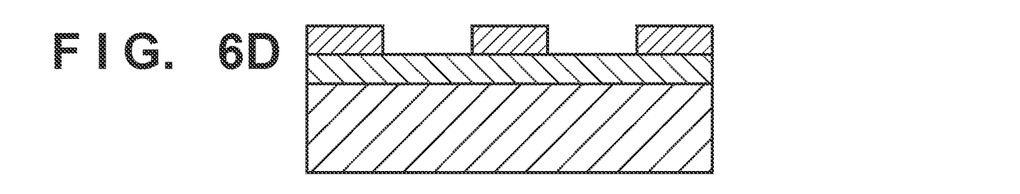

As shown in FIG. 6D, the pattern of the cured product of the imprint material 17 is formed on the substrate by separating the mold 11 and the substrate 12 from each other after curing the imprint material 17. The pattern of this cured product has a shape such that the concave portion of the mold 11 corresponds to the convex portion of the cured product, and the convex portion of the mold 11 corresponds to the concave portion of the cured product. That is, the concave-convex pattern of the mold 11 is transferred to the imprint material 17.

Figure 6E:
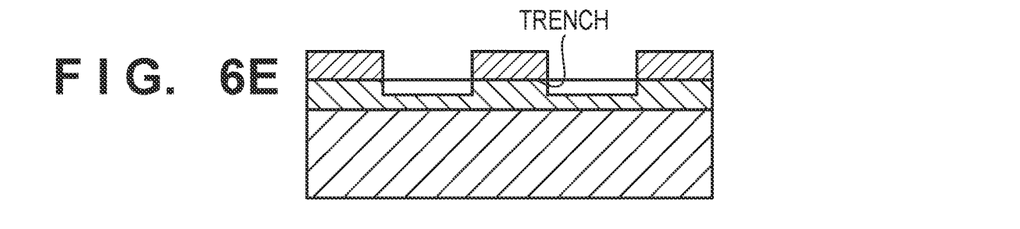
Figure 6F:
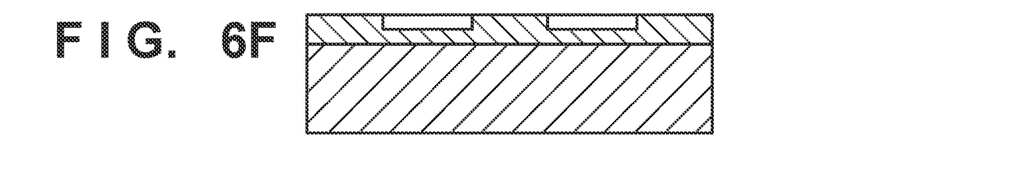

As shown in FIG. 6E, out of the surface of the processing target material, portions without the cured product or portions where the cured products remain thin are removed and become trenches by performing etching using the pattern of the cured product as an etching resistant mask. As shown in FIG. 6F, an article having the trenches formed on the surface of the processing target material can be obtained by removing the pattern of the cured product. Although the pattern of the cured product is removed here, the pattern of the cured product may be utilized as, for example, an interlayer dielectric film included in the semiconductor element or the like, that is, a constituent member of the article without removing it even after processing.

Modification

An embodiment in which the shape of the pattern region 23 on the substrate is corrected by using the heating unit 6 including the digital mirror device 28 has been described above. An embodiment in which a unit including the light source unit 24, the digital mirror device 28, and the light absorbing portion 26 is used to increase the viscosity of an uncured imprint material will be described hereinafter. According to this embodiment, it is possible to improve the positioning accuracy of the substrate 12 and the mold 11 by increasing the viscosity of the uncured imprint material.

The light source unit 24 generates light of a wavelength that increases the viscosity of an uncured imprint material supplied on the substrate 12. In general, the imprint material, which is a resin material to be supplied on the substrate 12, has low viscosity, and the imprint material can easily fill the pattern 13 of the mold 11. Here, when the imprint material has low viscosity, a positional shift between the mold 11 and the substrate 12 is easily caused by an external disturbance or the like. If the imprint material is cured in a state in which a positional shift has occurred between the mold 11 and the substrate 12, it is more likely to cause a reduction in the overlay accuracy.

Hence, the shot region on the substrate 12 and the pattern 13 of the mold 11 are positioned in a state in which the viscosity of the imprint material has been increased. This reduces the positional shift between the mold 11 and the substrate 12, thereby improving the overlay accuracy as a result.

For example, in the curing process of the imprint material, assume that the wavelength band of the ultraviolet rays with which the imprint material is irradiated is set between 200 nm and 400 nm. At this time, the wavelength band of the light that is to irradiate the imprint material to increase its viscosity can be set between 300 nm and 350 nm to increase the viscosity of the imprint material without over-curing the imprint material.

Note that the period in which the light which is to irradiate the imprint material to increase its viscosity can be set appropriately. For example, the irradiation operation of the light for increasing the viscosity can be started at or after a timing at which the mold 11 and the imprint material is brought into contact with each other or the irradiation operation of the light for increasing the viscosity can be started before a timing at which the mold 11 and the imprint material is brought into contact with each other.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2017-081437 filed on Apr. 17, 2017 and No. 2018-017577 filed on Feb. 2, 2018, which are hereby incorporated by reference herein in their entirety.

What is claimed is:

1. An imprint apparatus that performs an imprint process of forming a pattern of an imprint material on a processing target region on a substrate using a mold, the imprint apparatus comprising:
   a digital mirror device including two-dimensionally arrayed mirror elements and configured to irradiate the substrate with light reflected by the mirror elements;
   a sensor configured to measure, for each of a plurality of segments obtained by dividing a region where the mirror elements are arrayed to include a plurality of the mirror elements, a light amount of light emitted from each segment; and
   a controller configured to control the mirror elements included in each segment based on a measurement result of the sensor.

2. The apparatus according to claim 1, wherein the controller is configured to separately control the mirror elements included in each segment so that the light amount of light emitted from each of the plurality of segments will be a target light amount when the imprint process is to be performed.

3. The apparatus according to claim 2, wherein the controller is configured to control a ratio between an unirradiated time and an irradiated time of light by the mirror elements for each segment so as to obtain the target light amount.

4. The apparatus according to claim 3, wherein the controller is configured to specify, based on the measurement result, a minimum light amount among the light amounts of light emitted from the plurality of segments and calibrate the light amounts between the plurality of segments by using the minimum light amount as a reference.

5. The apparatus according to claim 2, wherein the controller is configured to control the number of mirror elements, among the mirror elements, that irradiate the substrate with light for each segment to obtain the target light amount.

6. The apparatus according to claim 5, wherein the controller is configured to specify the number of defective mirror elements, among the mirror elements, that cannot irradiate the substrate with light based on the measurement result and control the number of mirror elements that irradiate the substrate with light based on the number of defective mirror elements for each segment.

7. The apparatus according to claim 1, further comprising:
   a stage configured to hold the substrate and move,
   wherein the sensor is arranged on the stage.

8. The apparatus according to claim 7, wherein the sensor is configured to measure a light amount for each region that is smaller than a region on the substrate corresponding to each of the plurality of segments.

9. The apparatus according to claim 7, wherein the sensor is configured to measure the light amount of light emitted from each of the plurality of segments to the substrate in a period where the imprint process is not performed.

10. The apparatus according to claim 1, wherein the digital mirror device is configured to heat the processing target region to reduce a shape difference between a pattern portion of the mold and the processing target region.

11. The apparatus according to claim 1, wherein the digital mirror device is configured to irradiate the substrate with light that increases the viscosity of the imprint material on the substrate.

12. The apparatus according to claim 11, wherein the digital mirror device is configured to irradiate, after the mold and the imprint material are in contact with each other, the substrate with light that increases the viscosity of the imprint material on the substrate.

13. A method of manufacturing an article, the method comprising:
   forming a pattern on a substrate by using an imprint apparatus;
   processing the substrate on which the pattern has been formed in the forming; and
   manufacturing an article from the processed substrate,
   wherein the imprint apparatus performs an imprint process of forming a pattern of an imprint material on a processing target region on the substrate using a mold, and the imprint apparatus includes:
      a digital mirror device including two-dimensionally arrayed mirror elements and configured to irradiate the substrate with light reflected by the mirror elements;
      a sensor configured to measure, for each of a plurality of segments obtained by dividing a region where the mirror elements are arrayed to include a plurality of the mirror elements, a light amount of light emitted from each segment, and a controller configured to control the mirror elements included in each segment based on a measurement result of the sensor.

\* \* \* \* \*